US006569250B2

(12) United States Patent  
Paisley et al.

(10) Patent No.: US 6,569,250 B2
(45) Date of Patent: May 27, 2003

(54) GAS-DRIVEN ROTATION APPARATUS AND METHOD FOR FORMING SILICON CARBIDE LAYERS

(75) Inventors: Michael Paisley, Garner, NC (US); Joseph John Sumakeris, Apex, NC (US); Olle Kordina, Sturefors (SE)

(73) Assignee: Cree, Inc., Durham, NC (US)

( * ) Notice: Subject to any disclaimer, the term of this patent is extended or adjusted under 35 U.S.C. 154(b) by 113 days.

(21) Appl. No.: 09/756,548

(22) Filed: Jan. 8, 2001

(65) Prior Publication Data

US 2002/0090454 A1 Jul. 11, 2002

(51) Int. Cl.[7] ............................................. C23C 16/00
(52) U.S. Cl. ................................... 118/730; 156/345.55
(58) Field of Search ................................ 118/728, 729, 118/730, 500; 156/345.23, 345.51

(56) References Cited

U.S. PATENT DOCUMENTS

| | | | |
|---|---|---|---|
| 3,424,628 A | 1/1969 | Winings | 148/175 |
| 4,722,911 A | 2/1988 | Frijlink | 437/110 |
| 4,748,135 A | 5/1988 | Frijlink | 437/102 |
| 4,860,687 A | 8/1989 | Frijlink | 118/500 |
| 4,961,399 A | 10/1990 | Frijlink | 118/730 |
| 4,976,217 A | 12/1990 | Frijlink | 118/733 |
| 5,027,746 A | 7/1991 | Frijlink | 118/724 |
| 5,056,555 A | 10/1991 | Frijlink | 137/522 |
| 5,108,540 A | 4/1992 | Frijlink | 156/612 |
| 5,226,383 A | 7/1993 | Bhat | 18/730 |
| 5,468,299 A * | 11/1995 | Tsai | 118/730 |
| 5,558,721 A * | 9/1996 | Kohmura et al. | 118/730 |
| 5,674,320 A | 10/1997 | Kordina et al. | 118/500 |
| 5,695,567 A | 12/1997 | Kordina et al. | 118/725 |
| 5,704,985 A | 1/1998 | Kordina et al. | 118/725 |
| 5,759,263 A | 6/1998 | Nordell et al. | 117/98 |
| 5,788,777 A * | 8/1998 | Burk, Jr. | 118/730 |
| 5,792,257 A | 8/1998 | Kordina et al. | 117/90 |
| 5,858,102 A | 1/1999 | Tsai | 118/719 |
| 5,879,462 A | 3/1999 | Kordina et al. | 118/725 |
| 6,005,226 A * | 12/1999 | Aschner et al. | 213/390 |
| 6,030,661 A | 2/2000 | Kordina et al. | 427/248.1 |
| 6,039,812 A | 3/2000 | Ellison et al. | 118/725 |
| 6,048,398 A | 4/2000 | Vehanen et al. | 117/200 |
| 6,093,253 A | 7/2000 | Löfgren et al. | 118/725 |
| 2001/0002948 A1 * | 6/2001 | Aschner et al. | 392/418 |

OTHER PUBLICATIONS

Declaration of Michael Paisley under 37 C.F.R. § 1.132, dated Nov. 6, 2002.
Press Release, *Sterling Semiconductor Placed Order for Second Epigress SiC CVD System*, Oct. 24, 2001, at http://www.compoundsemiconductor.net/PressReleases/2001/PR10240102.htm.

* cited by examiner

*Primary Examiner*—Gregory Mills
*Assistant Examiner*—Karla Moore
(74) *Attorney, Agent, or Firm*—Myers Bigel Sibley & Sajovec

(57) ABSTRACT

A gas driven rotation apparatus includes a base member and a platter. The base member includes an upper surface and a mounting portion formed in the upper surface. The mounting portion includes an inner recess and an annular outer channel surrounding and spaced apart from the inner recess. A plurality of drive channels extend generally radially outwardly from the inner recess to the outer channel. The drive channels are substantially straight. A drive gas entrance passage extends through the base member and has an entrance opening in the inner recess. A drive gas exhaust passage extends through the base member and has an exhaust opening in the outer channel. The platter overlies the mounting portion. The drive channels are arranged and configured such that, when a drive gas flows through the drive channels, the drive gas causes the platter to rotate relative to the base member about an axis of rotation.

46 Claims, 7 Drawing Sheets

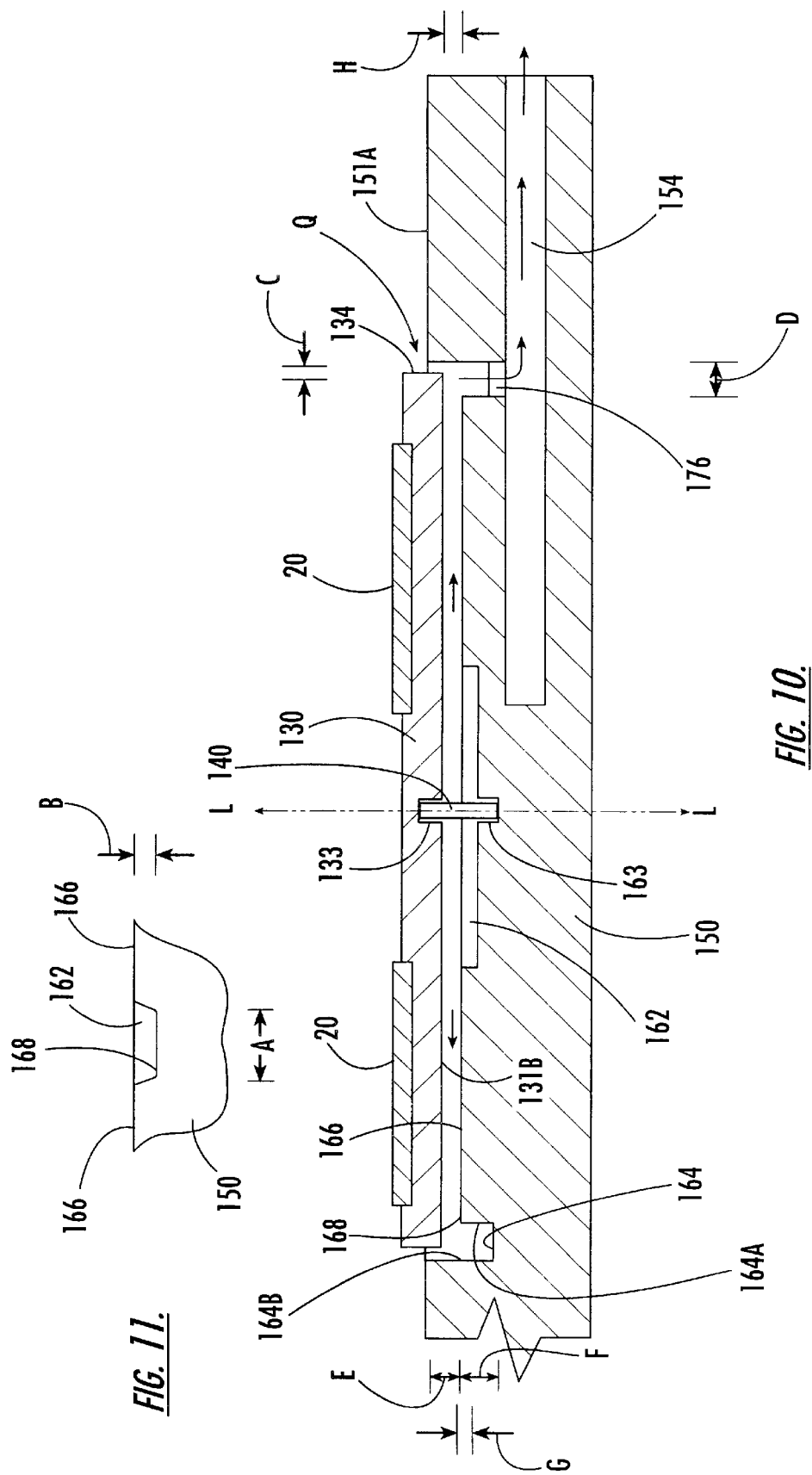

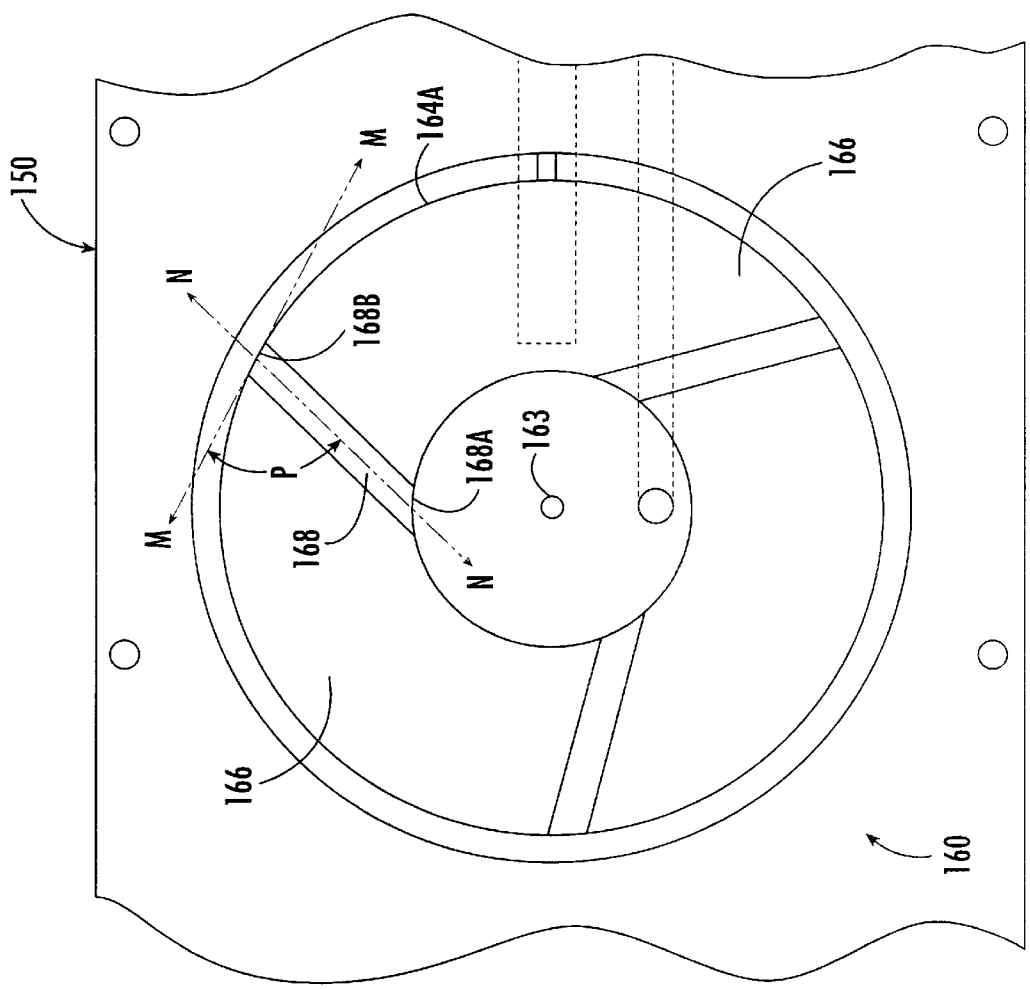

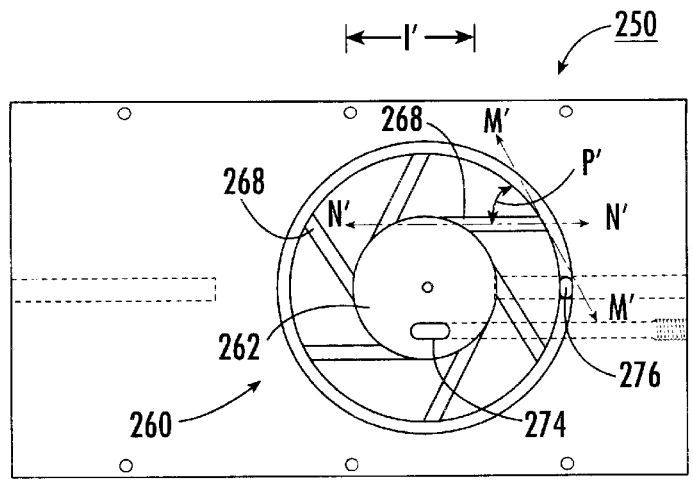
FIG. 13.
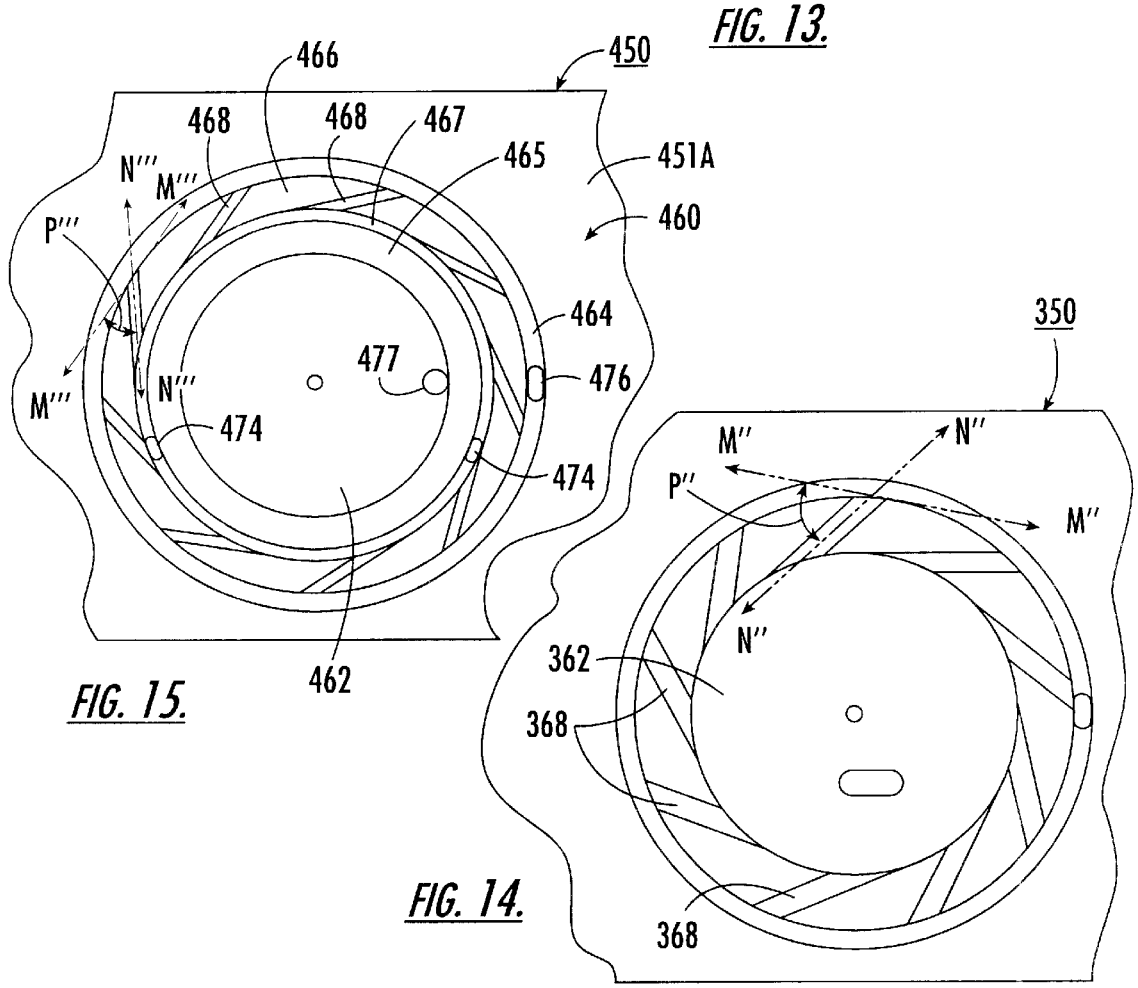
FIG. 15.
FIG. 14.

GAS-DRIVEN ROTATION APPARATUS AND METHOD FOR FORMING SILICON CARBIDE LAYERS

STATEMENT OF GOVERNMENT SUPPORT

The present invention was made, at least in part, with government support under Air Force Research Laboratory Contract No. F33615-99-C-5417. The United States government may have certain rights to this invention.

FIELD OF THE INVENTION

The present invention relates to methods and apparatus for forming silicon carbide layers on wafers and other substrates and, more particularly, to such methods and apparatus providing rotation of the wafer or other substrate.

BACKGROUND OF THE INVENTION

Silicon carbide (SiC) is increasingly recognized as an effective semiconductor material for electronic devices. SiC possesses a number of properties that make it particularly attractive for applications requiring devices to operate at high temperature, power and/or frequency. SiC exhibits highly efficient heat transfer and is capable of withstanding high electric fields.

It has been demonstrated that hot-wall chemical vapor deposition (CVD) reactors can provide epitaxial layers of SiC with morphology and doping superior to cold-wall systems. See, for example, U.S. Pat. No. 5,695,567 to Kordina et al., the disclosure of which is hereby incorporated herein by reference. It has further been demonstrated that the addition of substrate rotation to a hot-wall CVD system may improve both the per cycle capacity of the system and the uniformity of the epitaxial layers obtained. U.S. Pat. No. 4,860,687 to Frijlink discloses a device comprising a flat susceptor rotating parallel to a reference surface. The device disclosed therein may be used in a vapor phase epitaxy system.

SUMMARY OF THE INVENTION

According to preferred embodiments of the present invention, a gas driven rotation apparatus includes a base member and a platter. The base member includes an upper surface and a mounting portion formed in the upper surface. The mounting portion includes an inner recess and an annular outer channel surrounding and spaced apart from the inner recess. A plurality of drive channels extend generally radially outwardly from the inner recess to the outer channel. The drive channels are substantially straight. A drive gas entrance passage extends through the base member and has an entrance opening in the inner recess. A drive gas exhaust passage extends through the base member and has an exhaust opening in the outer channel. The platter overlies the mounting portion. The drive channels are arranged and configured such that, when a drive gas flows through the drive channels, the drive gas causes the platter to rotate relative to the base member about an axis of rotation.

Preferably, each of the drive channels defines a drive channel axis which is offset from the axis of rotation. The apparatus may include: a supplemental recess spaced apart from and disposed on a side of the inner recess opposite the outer channel; a landing located between the inner recess and the supplemental recess; and a second drive gas exhaust opening in the supplemental recess.

According to preferred embodiments of the present invention, a gas-driven rotation apparatus includes a base member and a platter. The base member includes a mounting portion having at least one generally radially extending drive channel. The at least one drive channel is substantially straight. A platter is disposed adjacent the mounting portion. The at least one drive channel is arranged and configured such that, when a drive gas flows through the at least one drive channel, the drive gas causes the platter to rotate relative to the base member about an axis of rotation.

Preferably, the at least one drive channel includes a plurality of generally radially extending drive channels formed in the mounting portion and each of the drive channels is substantially straight. Preferably, each of the drive channels defines a drive channel axis which is offset from the axis of rotation.

According to further preferred embodiments of the present invention, a gas driven rotation apparatus includes a base member and a platter. The base member includes a mounting portion having a first recess and a second recess spaced apart from the first recess. At least one drive channel extends generally radially from the first recess to the second recess. A drive gas entrance passage extends through the base member and has an entrance opening in the first recess. A drive gas exhaust passage extends through the base member and has an exhaust opening in the second recess. The platter is disposed adjacent the mounting portion. The at least one drive channel is arranged and configured such that, when a drive gas flows through the at least one drive channel, the drive gas causes the platter to rotate relative to the base member about an axis of rotation.

The apparatus may further include a drive gas supply device operative to provide a flow of drive gas through the drive gas entrance passage. The drive gas may include a noble gas. The apparatus may include a supplemental recess spaced apart from and disposed on a side of the first recess opposite the outer channel; a landing located between the first recess and the supplemental recess; and a second drive gas exhaust opening in the supplemental recess.

According to preferred method embodiments of the present invention, a method for forming a silicon carbide layer on a substrate includes providing a susceptor assembly. The susceptor assembly includes a base member and a platter. The base member includes a mounting portion having a first recess and a second recess spaced apart from the first recess. At least one drive channel extends generally radially from the first recess to the second recess. A drive gas entrance passage extends through the base member and has an entrance opening in the first recess. A drive gas exhaust passage extends through the base member and has an exhaust opening in the second recess. The platter is disposed adjacent the mounting portion. The substrate is placed on the platter. A reactant gas flow is directed across the substrate on the platter. A drive gas is directed into the gas entrance passage, through the entrance opening, through the at least one drive channel, into the exhaust opening, and through the drive gas exhaust passage whereby the drive gas causes the platter to rotate relative to the base member about an axis of rotation.

The method may include levitating the platter over the mounting portion using the drive gas. The exhaust passage may maintain the drive gas separate from the reactant gas flow. Preferably, the drive gas is argon gas.

Objects of the present invention will be appreciated by those of ordinary skill in the art from a reading of the Figures and the detailed description of the preferred embodiments which follow, such description being merely illustrative of the present invention.

BRIEF DESCRIPTION OF THE DRAWINGS

The accompanying drawings, which are incorporated in and constitute a part of the specification, illustrate embodiments of the invention and, together with the description, serve to explain principles of the invention.

FIG. 10 is an enlarged, fragmentary, cross-sectional view of the susceptor assembly of FIG. 1 taken along the line 9—9 of FIG. 7;

FIG. 11 is a partial, side view of the base member of the susceptor assembly of FIG. 1 showing an end view of a drive channel forming a part of the base member;

FIG. 12 is an enlarged, fragmentary, top plan view of the base member of the susceptor assembly of FIG. 1;

FIG. 13 is a top plan view of a susceptor assembly according to further embodiments of the present invention;

FIG. 14 is a top plan view of a susceptor assembly according to further embodiments of the present invention; and FIG. 15 is a top plan view of a susceptor assembly according to further embodiments of the present invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
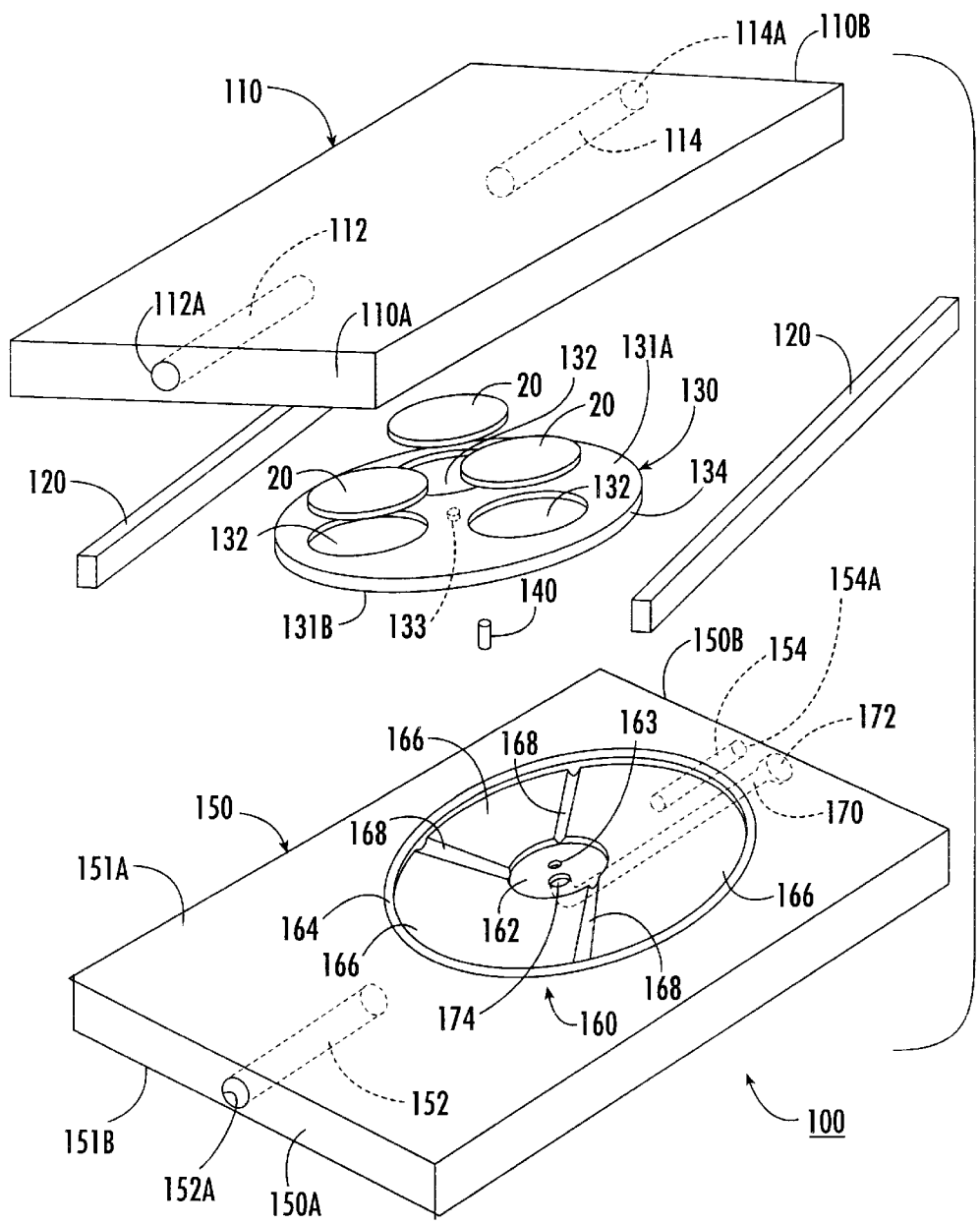
FIG. 1 is an exploded, perspective view of a susceptor assembly according to embodiments of the present invention.
Figure 2:
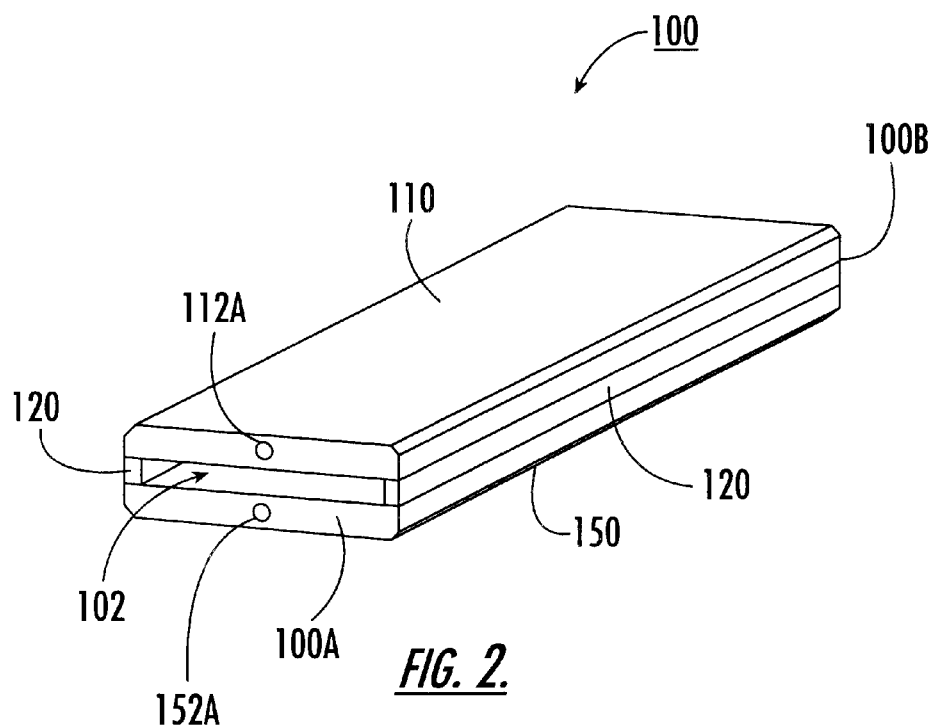
FIG. 2 is a perspective view of the susceptor assembly of FIG. 1.
Figure 3:
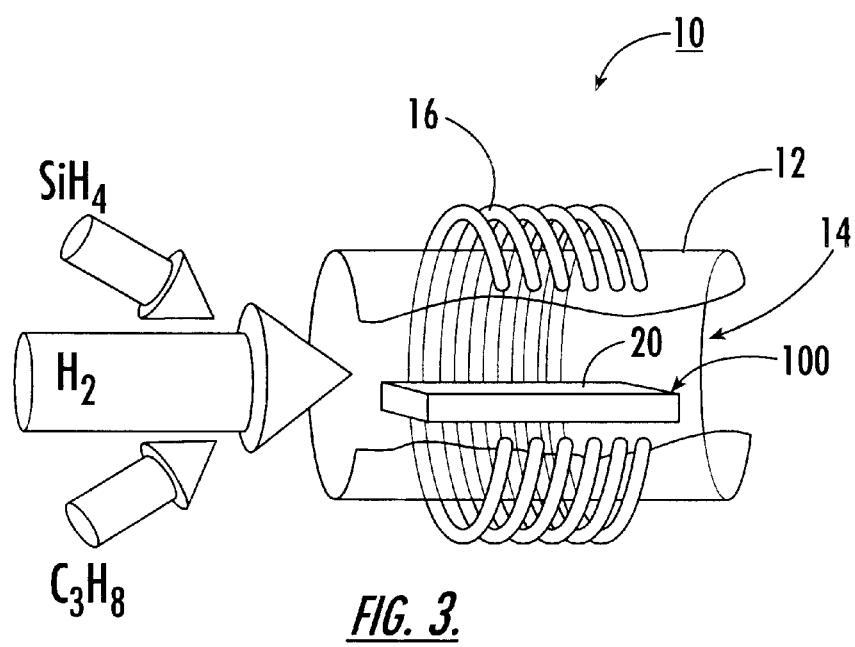
FIG. 3 is a schematic view of a hot-wall CVD system according to embodiments of the present invention incorporating the susceptor assembly of FIG. 1.

With reference to FIGS. 1 and 2, a susceptor assembly 100 according to the present invention is shown therein. The susceptor assembly 100 may be used in a hot-wall CVD system 10 as shown in FIG. 3, wherein the susceptor 100 is schematically illustrated. With the exception of the susceptor assembly 100, the hot-wall CVD system may be of conventional construction and use. The system 10 includes a quartz tube 12 defining a through passage 14. The tube 12 is surrounded by an RF coil 16. The assembly 100 is disposed in the tube 12. Precursor gases such as silane ($SiH_4$) and propane ($C_3H_8$) are introduced with and transported by a carrier of purified hydrogen gas ($H_2$) into and through the tube 12. The RF coil 16 inductively heats the susceptor assembly 100 to provide a hot zone where the SiC deposition reactions take place. More particularly, a layer of SiC is grown on the exposed surfaces of the target wafers 20 (schematically illustrated in FIG. 3). Modifications to the system 10 and the method of using the same will be understood by those of ordinary skill in the art upon reading the description herein.

Turning to the susceptor assembly 100 in greater detail, and as best seen in FIGS. 1 and 2, the assembly 100 includes a cover member 110, side wall members 120 and a base member 150 forming a box which is open at an upstream or entrance end 100A and at an exit or downstream end 100B of the assembly 100. The members 110, 120, 150 may be joined by fasteners (not shown), for example. A passage 102 extends fully through the assembly 100 from the end 100A to the end 100B. A carrier or platter 130 is disposed in the passage 102 and is mounted for rotation about a pin or spindle 140. The platter 130 is preferably disk-shaped as illustrated.

The members 110, 120, 150, the platter 130 and the spindle 140 are preferably formed of high purity graphite with a fully surrounding coating of dense SiC (i.e., impervious and having 0% porosity). Alternatively, the platter 130 may be formed of solid SiC or a solid SiC alloy.

The cover member 110 has pyrometer passages 112 and 114 formed therein adjacent the entrance end 100A and the exit end 100B, respectively, and adapted to receive a pyrometer for monitoring the temperature across the assembly 100. The passages 112 and 114 terminate in openings 112A and 114A, respectively.

Figures 4, 5:
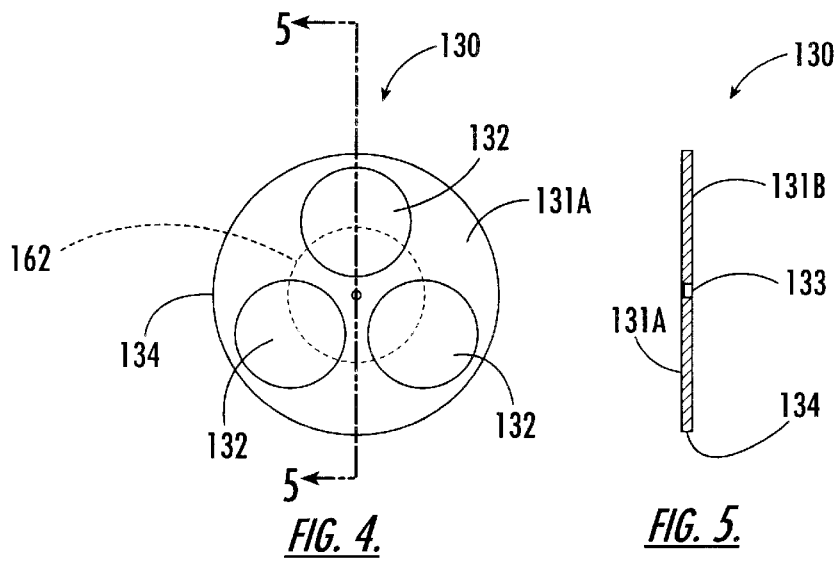
FIG. 4 is a top plan view of a platter forming a part of the susceptor assembly of FIG. 1.
FIG. 5 is a cross-sectional view of the platter of FIG. 4 taken along the line 5—5 of FIG. 4.

With reference to FIGS. 1, 4 and 5, the platter 130 is substantially circular and has an upper surface 131A, an opposing lower surface 131B, and an outer peripheral edge 134. Wafer pockets 132 are formed in the upper surface 131A. A spindle recess 133 is formed in the lower surface 131B. The lower surface 131B is preferably substantially smooth without any grooves or protrusions other than the spindle recess 133. Preferably, the thickness of the platter 130 is substantially uniform in the regions of the wafer pockets 132. More preferably and as illustrated, the thickness of the platter 130 is substantially uniform across the full width of the platter 130 with the exception of the spindle recess 133 and the wafer pockets 132. The lower surface 131B is preferably coated with SiC.

With reference to FIGS. 1 and 6–11, the base member 150 has an upper surface 151A and an opposing lower surface 151B. Pyrometer passages 152 and 154 are formed in the base member 150 adjacent the entrance end 100A and the exit end 100B, respectively, and are adapted to receive a pyrometer. The passages 152 and 154 terminate in openings 152A and 154A, respectively. The base member 150 further includes a platter mounting portion 160 formed in the upper surface 151A as discussed in more detail below. A gas supply passage 170 is formed in the base member 150 and fluidly communicates with a threaded inlet opening 172 and an outlet opening 174 (see FIGS. 1, 6 and 9) in the portion 160. A connecting passage 176 provides fluid communication between the portion 160 and the passage 154, as discussed below.

The platter mounting portion 160 is preferably a recess or depression as illustrated. The portion 160 has a relatively deep, circumferential, endless channel 164, an inner or central recess 162 and a plurality of straight (i.e., rectilinear), generally radially extending channels 168 (hereinafter "drive channels") which, in combination, form a plurality of landings 166 therebetween. Preferably, the channels 168 do not deviate from straight by more than standard, low cost manufacturing processes permit (typically on the order of 0.001 inch per inch of channel length). The drive channels 168 are preferably symmetrically positioned with equidistant spacing about the central recess 162. More or fewer drive channels 168 may be provided. The central recess 162 is preferably circular and the channel 164 and the central recess 162 are preferably substantially concentric as shown. In FIG. 4, the periphery of the central recess 162 is indicated by dashed lines to illustrate the relative positions of the platter 130 and the central recess 162 when the platter 130 is mounted on the portion 160.

A spindle recess 163 is formed in the center of the central recess 162. The opening 174 is formed in the central recess 162 at a position offset from the center of the central recess 162.

The outer vertical wall 164B of the channel 164 extends up to the surrounding portion of the upper surface 151A. The inner vertical wall 164A of the channel 164 extends up to the landings 166. The connecting passage 176 has an upper opening in the bottom wall of the channel 164 and a lower opening at the passage 154.

The drive channels 168 each extend from an entrance end 168A to an exit end 168B. The entrance ends 168A each intersect the central recess 162 and the exit ends 168B each intersect the channel 164 as best seen in FIGS. 1 and 9–11. The drive channels 168 extend at an angle with respect to a central axis of rotation L—L (see FIGS. 7 and 10). More particularly, and with reference to FIG. 12, each drive channel 168 defines a central channel axis N—N that extends through the center of the channel 168. The axis N—N is offset from (i.e., does not intersect) the axis of rotation L—L. A straight reference line M—M intersects the channel axis N—N at the exit end 168B of the drive channel 168 and is tangential to a reference circle defined by the inner vertical wall 164A of the channel 164. The channel axis N—N and the reference line M—M define an included angle P therebetween. The angle P is less than 90 degrees. More preferably, the angle P is between about 35 and 75 degrees. Most preferably, the angle P is between about 45 and 65 degrees.

A drive gas supply device 171 (FIG. 6) is connected to the threaded inlet opening 172 for fluid communication with the passage 170. The gas supply device 171 is operable to force a flow of pressurized drive gas into the gas supply passage 170. The drive gas supply device 171 may be alternatively or additionally connected to the drive gas exhaust passage 154 to draw the drive gas from the base member 150. Suitable gas supply devices include Gilmont Instruments mass flow controllers available from Barnant Co. of Barrington, Ill. Preferably, the drive gas is non-reactive. More preferably, the drive gas is noble, particularly argon or helium. Most preferably, the drive gas is argon.

As best seen in FIG. 10, the platter 130 is mounted over and partially within the mounting portion 160. In each of FIGS. 8–10, the platter 130 is shown in a floating or levitated position as discussed below. The lower end of the spindle 140 is disposed in the recess 163 and the upper end of the spindle 140 is disposed in the recess 133 (see FIG. 1). The central axis of the spindle 140 defines the axis of rotation L—L, which is orthogonal to the upper surface 131A (FIG. 1) of the platter 130. The recess 133 is sized such that the platter 130 can slide freely vertically up and down along the spindle 140 and such that the platter 130 can rotate freely about the spindle 140 about the axis L—L.

Preferably, the drive channels 168 have a width A (FIG. 11) of between about 0.5 and 0.1 inch. Preferably, the drive channels 168 have a depth B (FIG. 11) of between about 0.002 and 0.020 inch.

Preferably, the outer vertical wall 164B of the channel 164 and the outer peripheral edge 134 of the platter 130 define a gap Q therebetween having a width C (FIG. 10) of between about 0.100 and 0.010 inch. Preferably, the channel 164 has a width D (FIG. 10) of between about 0.250 and 0.050 inch and a depth F (FIG. 10) below the landings 166 of between about 0.100 and 0.020 inch. The lengths J of the drive channels 168 and the diameter K of the inner vertical wall 164A (FIG. 6) will depend on the size of the platter 130.

Preferably, the landings 166 are vertically recessed below the top surface 151A a distance E (FIG. 10), which is approximately the same as the thickness of the platter 130. Preferably, the central recess 162 is vertically recessed from the landings 166 a distance G (FIG. 10) of between about 0.100 and 0.010 inch. Preferably, the central recess 162 has a diameter I (FIG. 6) of between about 1.00 inch and 50% of the platter diameter.

The susceptor assembly 100 may be used in the following manner. Initially, the platter 130 is disposed in the platter mounting portion 160 such that the platter 130 rests on the landings 166. Before or after the platter 166 is mounted on the portion 160, the wafers 20 are placed in the pockets 132.

Figure 8:
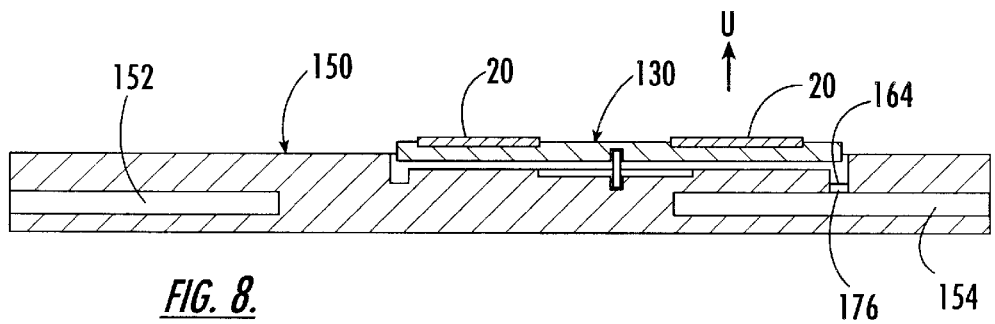
FIG. 8 is a cross-sectional view of the susceptor assembly of FIG. 1 taken along the line 8—8 of FIG. 7.

The gas supply device 171 is then actuated. The gas supply device 171 forces the drive gas through the inlet opening 172, the passage 180 and the outlet opening 174 as indicated by the arrows in FIGS. 6 and 9. The drive gas enters the plenum formed by the central recess 162 and the overlying platter 130 from the outlet opening 174. The drive gas in the plenum is pressurized until the differential between the drive gas pressure and the ambient pressure (i.e., acting on the upper surface 131A of the platter 130) overcomes the gravitational force on the platter. In this manner, the pressurized drive gas forces the platter 130 upwardly (i.e., in the direction U; FIG. 8).

Figure 6:
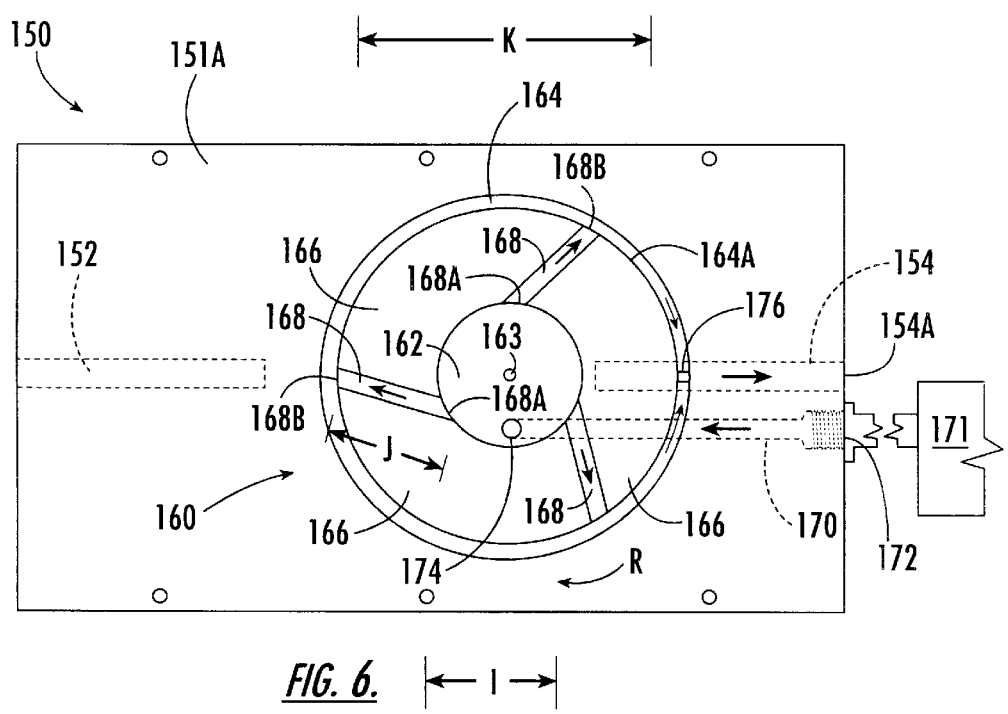
FIG. 6 is a top plan view of a drive gas supply device and a base member forming a part of the susceptor assembly of FIG. 1.
Figure 7:
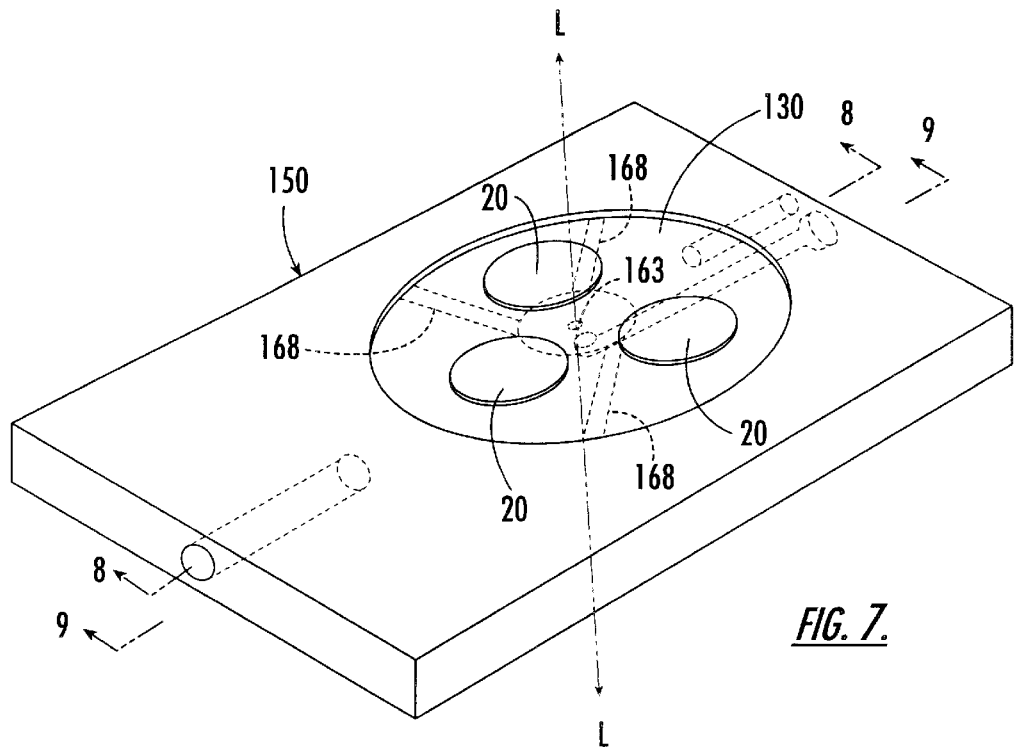
FIG. 7 is a partial, perspective view of the susceptor assembly of FIG. 1 wherein a cover member and side members of the susceptor assembly are removed for clarity.

Once the platter 130 is levitated, the drive gas flows outwardly from the central recess 162 between the platter 130 and the portion 160 of the base member 150 and into the channel 164 as indicated by arrows in FIGS. 6 and 10. At least a portion, and preferably a predominant portion, of the drive gas flows from the central recess 162 to the channel 164 through the drive channels 168 as indicated by the arrows in FIG. 6.

The drive gas exits the channel 164 through the connecting passage 176 and is exhausted from the base member 150 through the pyrometer passage 154. A small portion of the drive gas may exit the channel 164 through the gap between the peripheral edge 134 and the outer vertical wall of the channel 164. Preferably no more than 20% of the drive gas is exhausted through this gap.

Figure 9:
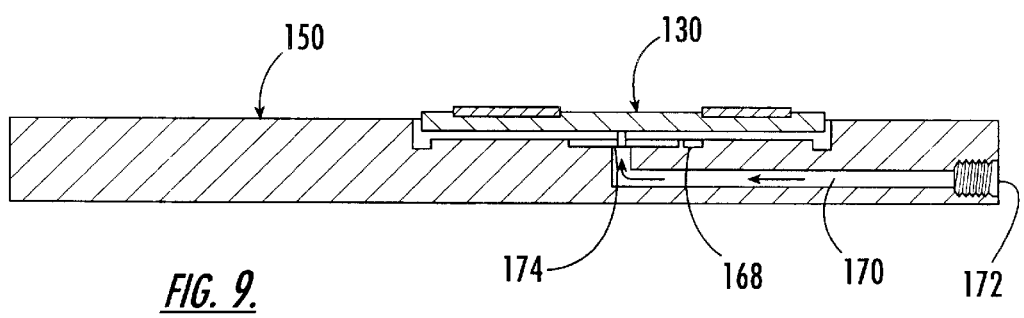
FIG. 9 is a cross-sectional view of the susceptor assembly of FIG. 1 taken along the line 9—9 of FIG. 7.

The drive gas is continuously forced through the assembly 100 at a rate and pressure sufficient to maintain the platter 130 in a levitated position above the landings 166 as shown in FIGS. 8–10. The levitation height may be controlled by selection of the width and depth of the drive channels 168, the diameter of the central recess 162, the pressure of the drive gas between the platter 130 and the portion 160, and the drive gas flow rate. Preferably, at least a portion of the peripheral edge 134 is maintained below the top surface 151A to reduce leakage of the drive: gas through the adjacent gap Q.

Additionally, the drive gas flow through the drive channels 168 is viscously coupled to the lower surface 131B of the platter 130. Because of the angled orientation of the drive channels 168, the platter 130 is thereby rotated about the axis L—L in a clockwise direction R (FIG. 6) by the flowing gas. The rate of rotation may be controlled by selection of the angle P (FIG. 12) defined by the drive channels 168 as well as the depth, width and length of the drive channels 168. Preferably, the rate of rotation of the platter 130 is between about 3 and 60 revolutions per minute (rpm).

The assembly 100 provides a number of advantages. It is desirable to use argon (Ar) or like gases (e.g., other noble gases) as the drive gas because such gases are less likely than $H_2$ gas to pick up impurities such as boron (B), aluminum (Al), titanium (Ti), chromium (Cr), and vanadium (V) from the graphite, for example, and redeposit these impurities, for example, onto the wafer surface. However, the thermal conductivity of Ar gas is substantially less than that of $H_2$ gas. As a result, Ar gas present in the reactant gas flow through the tube 12 (FIG. 3) may slow the transfer of heat to the reactants, thereby creating irregularities in the temperature profile of the reactant gas flow. Because the assembly 100 provides for exhaust of the drive gas with only minimal introduction of the drive gas into the reactant stream, Ar gas may be used as the drive gas without jeopardizing the reactant stream temperature profile.

Because the thickness of the platter 130 is substantially uniform, uniformity of the temperature distribution across the platter 130 is facilitated. Temperature uniformity across the platter 130 is further facilitated by the uniform distribution of the drive channels 168 between the central recess 162 and proximate the peripheral edge 134 of the platter 130.

The straight drive channels 168 may be more easily and accurately machined than, for example, curved channels. The gas entry opening 174 need not be centrally located to prevent tilting or skewing of the platter 130.

Across a substantial range of drive gas flow rates, the spin rate of the platter 130 may be maintained at a given rate substantially independent of the drive gas flow rate. This allows for greater consistency (i.e., repeatability) in processing. Additionally, this behavior allows for adjustment of the platter levitation height H by altering the drive gas flow rate.

With reference to FIG. 13, a base member 250 of a susceptor assembly according to further embodiments of the invention is shown therein. The remainder of the susceptor assembly may be constructed in the manner described above with regard to the susceptor assembly 100 and the susceptor assembly may be used in the same manner.

The base member 250 differs from the base member 150 in the configuration of the platter mounting portion 260. The diameter I' of the central recess 262 is greater than the diameter I of the central recess 162. The angle P' defined between the center axis N'—N' of each channel 168 and a respective tangential reference line M'—M' (corresponding to the reference line M—M) is less than the angle P. Preferably, the angle P' is between about 45 and 65 degrees. The reduced angle P' serves to increase the spin rate of the platter as compared to that provided by the angle P under the same conditions within the intended operating parameters. Additionally, the inlet opening 174 and the exhaust opening 276 are elongated.

With reference to FIG. 14, a base member 350 according to further embodiments of the invention is shown therein.

The base member 350 differs from the base member 250 in that the diameter of the central recess 362 is further increased and the angle P" (defined between the center axis N"—N" and the tangential reference line M"—M") is less than the angle P'. Preferably, the angle P" is between about 35 and 55 degrees With reference to FIG. 15, a base member 450 of a susceptor assembly according to further embodiments of the invention is shown therein. The remainder of the susceptor assembly may be constructed in the manner described above with regard to the susceptor assembly 100 and the susceptor assembly may be used in the same manner.

The base member 450 differs from the base member 150 in the configuration of the platter mounting portion 460. The portion 460 includes a central recess 462 enlarged relative to, but otherwise corresponding to, the central recess 162. The central recess 462 is surrounded by an annular landing 465. The landing 465 has an upper face disposed above the bottom wall of the recess 462 and below the top surface 451A of the base member 450. An endless, annular channel 467 surrounds the landing 465. A second endless, annular channel 464 surrounds the channel 467. A plurality of drive channels 468 extend between the channels 467 and 464. The channel 467, the channel 464 and the channels 468 define a plurality of landings 466. The angle P''' defined between the center axis N'''—N''' of each drive channel 468 and the respective tangential reference line M'''—M''' is preferably between about 25 and 45 degrees.

In use, the drive gas is forced into the channel 467 through inlet ports 474. The drive gas levitates the platter (not shown in FIG. 15) and flows through the channels, 468 to the annular channel 464. The drive gas then exits the channel 464 through an exhaust port 476 corresponding to the opening 176. A portion of the drive gas may pass inwardly between the landing 465 and the levitated platter and into the central recess 462. This gas may exit the recess 462 through a second, low pressure exhaust port 477. The base member 450 may be used in place of the base member 150, for example, to increase the amount of rotational drive as compared to the levitation force.

As described above, the drive gas preferably flows from an inner recess (e.g., the inner recess 162) to an outer channel (e.g., the outer channel 164). However, the direction of flow may be reversed (i.e., the drive gas being supplied through the passage 154 and exhausted through the passage 170).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A gas driven rotation apparatus comprising:
   a) a base member including:
      an upper surface;

a mounting portion formed in said upper surface, said mounting portion including:
an inner recess;
an annular outer channel surrounding and spaced apart from said inner recess; and
a plurality of drive channels extending generally radially outwardly from said inner recess to said outer channel, wherein said drive channels are substantially straight;
a drive gas entrance passage extending through said base member and having an entrance opening in said inner recess; and
a drive gas exhaust passage extending through said base member and having an exhaust opening in said outer channel; and
b) a platter overlying said mounting portion;
c) wherein said drive channels are arranged and configured such that, when a drive gas flows through said drive channels, the drive gas causes said platter to rotate relative to said base member about an axis of rotation.

2. The apparatus of claim 1 wherein each of said drive channels defines a drive channel axis which is offset from said axis of rotation.

3. The apparatus of claim 2 wherein each of said drive channel axes defines an angle of between about 35 and 75 degrees with a reference line tangential to said outer channel at an intersection of said drive channel axis and said outer channel.

4. The apparatus of claim 1 wherein said inner recess, said drive channels and said outer channel define a plurality of landings therebetween, and wherein each of said landings has an upper surface disposed below said upper surface of said base member.

5. The apparatus of claim 1 including a spindle between said platter and said base member.

6. The apparatus of claim 1 wherein said axis of rotation is vertically oriented.

7. The apparatus of claim 1 including a drive gas supply device operative to provide a flow of drive gas through said drive gas entrance passage.

8. The apparatus of claim 1 including a cover member overlying said platter and said base member.

9. The apparatus of claim 8 including a pair of side members extending between said cover and base members on opposed sides of said platter, wherein said cover, base and side members define a through passage and opposed end openings, said platter being disposed in said through passage.

10. The apparatus of claim 1 including:
a) a supplemental recess spaced apart from and disposed on a side of said inner recess opposite said outer channel;
b) a landing located between said inner recess and said supplemental recess; and
c) a second drive gas exhaust opening in said supplemental recess.

11. The apparatus of claim 10 wherein said inner recess includes a annular channel surrounding said supplemental recess.

12. The apparatus of claim 1 wherein said platter is formed of solid silicon carbide or a solid silicon carbide alloy.

13. A gas driven rotation apparatus comprising:
a) a base member including a mounting portion including at least one generally radially extending drive channel, wherein said at least one drive channel is substantially straight; and
b) a platter disposed adjacent said mounting portion and having a platter surface;
c) wherein said at least one drive channel is open in a direction facing said platter and is arranged and configured such that, when a drive gas flows through said at least one drive channel, the drive gas viscously couples with said platter surface as the drive gas flows along said at least one drive channel and thereby causes said platter to rotate relative to said base member about an axis of rotation.

14. The apparatus of claim 13 wherein said at least one drive channel includes a plurality of generally radially extending drive channels formed in said mounting portion and each of said drive channels is substantially straight.

15. The apparatus of claim 14 wherein each of said drive channels defines a drive channel axis which is offset from said axis of rotation.

16. The apparatus of claim 15 wherein each of said drive channel axes defines an angle of between about 35 and 75 degrees with a reference line tangential to a reference circle at an intersection of said drive channel axis and said reference circle, said reference circle being centered about said axis of rotation.

17. The apparatus of claim 13 wherein said mounting portion includes first and second spaced apart recesses and said at least one drive channel extends from said first recess to said second recess.

18. The apparatus of claim 13 wherein said mounting portion is formed in an upper surface of said base member, said platter overlies said mounting portion, and said axis of rotation is vertically oriented.

19. A gas driven rotation apparatus comprising:
a) a base member including:
a mounting portion including:
a first recess;
a second recess spaced apart from said first recess; and
at least one drive channel extending generally radially from said first recess to said second recess;
a drive gas entrance passage extending through said base member and having an entrance opening in said first recess; and
a drive gas exhaust passage extending through said base member and having an exhaust opening in said second recess; and
b) a platter disposed adjacent said mounting portion and having a platter surface;
c) wherein said at least one drive channel is open in a direction facing said platter and is arranged and configured such that, when a drive gas flows through said at least one drive channel, the drive gas viscously couples with said platter surface as the drive gas flows along said at least one drive channel and thereby causes said platter to rotate relative to said base member about an axis of rotation.

20. The apparatus of claim 19 including a drive gas supply device operative to provide a flow of drive gas through said drive gas entrance passage.

21. The apparatus of claim 20 wherein said drive gas includes a noble gas.

22. The apparatus of claim 19 including:
a) a supplemental recess spaced apart from and disposed on a side of said first recess opposite said second recess;
b) a landing located between said first recess and said supplemental recess; and
c) a second drive gas exhaust opening in said supplemental recess.

23. The apparatus of claim 19 wherein said at least one drive channel includes a plurality of generally radially extending drive channels formed in said mounting portion.

24. The apparatus of claim 23 wherein each of said drive channels is substantially straight.

25. The apparatus of claim 24 wherein each of said drive channels defines a drive channel axis which is offset from said axis of rotation.

26. The apparatus of claim 25 wherein each of said drive channel axes defines an angle of between about 35 and 75 degrees with a reference line tangential to a reference circle at an intersection of said drive channel axis and said reference circle, said reference circle being centered about said axis of rotation.

27. The apparatus of claim 19 wherein said mounting portion is formed in an upper surface of said base member, said platter overlies said mounting portion, and said axis of rotation is vertically oriented.

28. A method for forming a silicon carbide layer on a substrate, said method comprising the steps of:
 a) providing a susceptor assembly including:
  a base member including:
   a mounting portion including:
    a first recess;
    a second recess spaced apart from the first recess; and
    at least one drive channel extending generally radially from the first recess to the second recess;
   a drive gas entrance passage extending through the base member and having an entrance opening in the first recess; and
   a drive gas exhaust passage extending through the base member and having an exhaust opening in the second recess; and
  a platter disposed adjacent the mounting portion and having a platter surface, wherein the at least one drive channel is open in a direction facing the platter;
 b) placing the substrate on the platter;
 c) directing a reactant gas flow across the substrate on the platter; and
 d) directing a drive gas into the gas entrance passage, through the entrance opening, through the at least one drive channel, into the exhaust opening, and through the drive gas exhaust passage such that the drive gas viscously couples with the platter surface as the drive gas flows along the at least one drive channel and thereby causes the platter to rotate relative to the base member about an axis of rotation.

29. The method of claim 28 including levitating the platter over the mounting portion using the drive gas.

30. The method of claim 28 wherein the exhaust passage maintains the drive gas separate from the reactant gas flow.

31. The method of claim 28 wherein the drive gas is a noble gas.

32. The method of claim 28 wherein the at least one drive channel includes a plurality of generally radially extending drive channels formed in the mounting portion.

33. The method of claim 32 wherein each of the drive channels is substantially straight.

34. The method of claim 33 wherein each of the drive channels defines a drive channel axis which is offset from the axis of rotation.

35. The apparatus of claim 28 wherein said mounting portion is formed in an upper surface of said base member, said platter overlies said mounting portion, and said axis of rotation is vertically oriented.

36. A method for forming a silicon carbide layer on a substrate, said method comprising the steps of:
 a) providing a gas driven rotation apparatus including:
  a base member including:
   an upper surface;
   a mounting portion formed in the upper surface, the mounting portion including:
    an inner recess;
    an annular outer channel surrounding and spaced apart from the inner recess; and
    a plurality of drive channels extending generally radially outwardly from the inner recess to the outer channel, wherein the drive channels are substantially straight;
   a drive gas entrance passage extending through the base member and having an entrance opening in the inner recess; and
   a drive gas exhaust passage extending through the base member and having an exhaust opening in the outer channel; and
  a planer overlying the mounting portion;
  wherein the drive channels are arranged and configured such that, when a drive gas flows through the drive channels, the drive gas causes the platter to rotate relative to the base member about an axis of rotation;
 b) placing the substrate on the platter;
 c) directing a reactant gas flow across the substrate on the platter; and
 d) directing a drive gas into the gas entrance passage, through the entrance opening, through the drive channels, into the exhaust opening, and through the drive gas exhaust passage whereby the drive gas causes the platter to rotate relative to the base member about an axis of rotation.

37. The method of claim 36 including levitating the platter over the mounting portion using the drive gas.

38. The method of claim 36 wherein the exhaust passage maintains the drive gas separate from the reactant gas flow.

39. The method of claim 36 wherein the drive gas is a noble gas.

40. The method of claim 36 wherein each of the drive channels defines a drive channel axis which is offset from the axis of rotation.

41. The apparatus of claim 36 wherein the axis of rotation is vertically oriented.

42. A gas driven rotation apparatus comprising:
 a) a base member including:
  a mounting portion including:
   a first recess;
   a second recess spaced apart from said first recess; and
   at least one drive channel extending generally radially from said first recess to said second recess;
  a drive gas entrance passage extending through said base member and having an entrance opening in said first recess; and
  a drive gas exhaust passage extending through said base member and having an exhaust opening in said second recess; and
 b) a platter overlying said mounting portion, said platter overlying each of said first recess, said second recess and said at least one drive channel;
 c) wherein said at least one drive channel is arranged and configured such that, when a drive gas flows through said at least one drive channel, the drive gas causes said platter to rotate relative to said base member about an axis of rotation.

43. The apparatus of claim 42 including:

a) a supplemental recess spaced apart from and disposed on a side of said first recess opposite said second recess;

b) a landing located between said first recess and said supplemental recess; and c) a second drive gas exhaust opening in said supplemental recess.

44. A gas driven rotation apparatus comprising:

a) a base member including a mounting portion including a plurality of radially extending drive channels, wherein each of said drive channels is substantially straight; and b) a platter overlying said mounting portion, said platter overlying each of said drive channels;

c) wherein said at least one drive channel is arranged and configured such that, when a drive gas flows through said at least one drive channel, the drive gas causes said platter to rotate relative to said base member about an axis of rotation.

45. A gas driven rotation apparatus comprising:

a) a base member including a mounting portion including at least one generally radially extending drive channel, wherein said at least one drive channel is substantially straight; and b) a platter disposed adjacent said mounting portion;

c) wherein said at least one drive channel is arranged and configured such that, when a drive gas flows through said at least one drive channel, the drive gas causes said platter to rotate relative to said base member about an axis of rotation;

d) wherein said drive channel defines a drive channel axis which is offset from said axis of rotation.

46. The apparatus of claim 45 wherein said drive channel axis defines an angle of between about 35 and 75 degrees with a reference line tangential to a reference circle at an intersection of said drive channel axis and said reference circle, said reference circle being centered about said axis of rotation.

* * * * *